United States Patent [19]

Ochi

[11] 4,138,614
[45] Feb. 6, 1979

[54] JFET SWITCH CIRCUIT

[75] Inventor: Sam S. Ochi, San Jose, Calif.

[73] Assignee: National Semiconductor Corporation, Santa Clara, Calif.

[21] Appl. No.: 834,220

[22] Filed: Sep. 16, 1977

Related U.S. Application Data

[62] Division of Ser. No. 754,482, Dec. 27, 1976, Pat. No. 4,085,417.

[51] Int. Cl.² .................... H03K 17/60; H03K 17/04; H03K 17/16; H03K 17/72
[52] U.S. Cl. .................... 307/251; 307/255; 307/304; 330/300; 357/22; 357/43
[58] Field of Search ............... 307/240, 251, 351, 352, 307/353, 255; 328/150, 151; 330/144, 145, 300; 357/22, 43

[56] References Cited

U.S. PATENT DOCUMENTS

| 3,456,166 | 7/1969 | Welty | 307/251 X |
|---|---|---|---|
| 3,731,116 | 5/1973 | Hill | 307/251 |
| 3,740,581 | 6/1973 | Pfiffner | 307/251 |
| 3,895,238 | 7/1975 | Saari | 307/251 X |
| 3,902,078 | 8/1975 | Peterson | 307/251 |
| 3,911,294 | 10/1975 | Davis et al. | 307/251 |
| 3,916,222 | 10/1975 | Compton | 307/251 |
| 3,955,103 | 5/1976 | Russell et al. | 307/251 |
| 4,020,365 | 4/1977 | Weir | 307/251 |
| 4,042,836 | 8/1977 | Compton et al. | 307/251 |

Primary Examiner—Larry N. Anagnos
Attorney, Agent, or Firm—Gail W. Woodward

[57] ABSTRACT

JFET and bipolar transistor devices are combined into an analog signal switching circuit. A JFET acts as a switch device for controlling analog signals. The JFET gate is charged through a bipolar transistor to turn if off and discharged through a second bipolar transistor to turn it on. A second JFET is used to control the conduction of the second bipolar transistor so that it only conducts heavily when a high slew rate is needed. The circuit can switch analog signals very rapidly and yet has very low quiescent current drain in both off and on states. The circuit is very simple and is amenable to monolithic integrated circuit construction.

6 Claims, 5 Drawing Figures

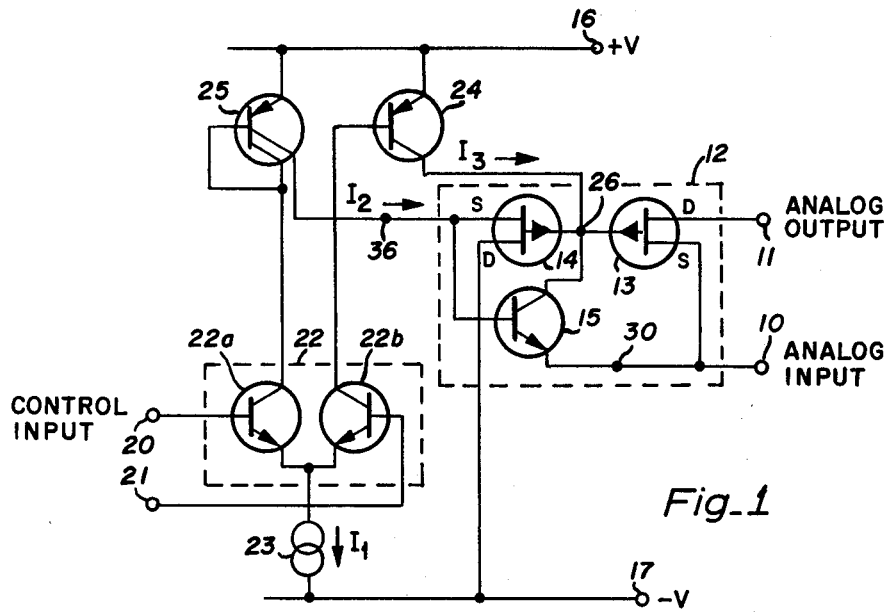
Fig_1
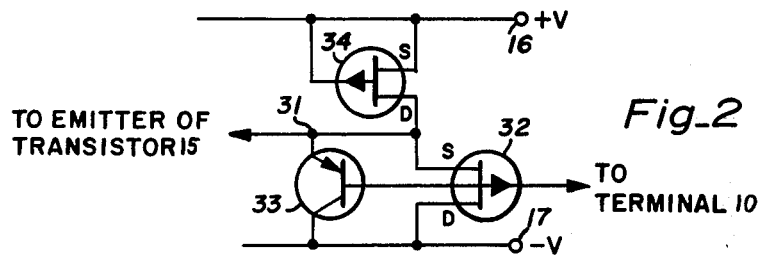
Fig_2
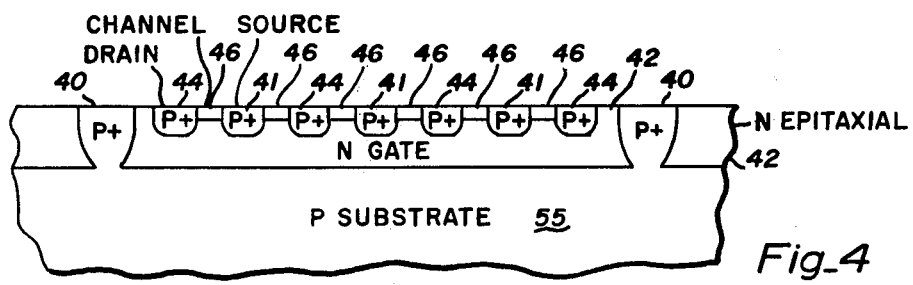
Fig_4
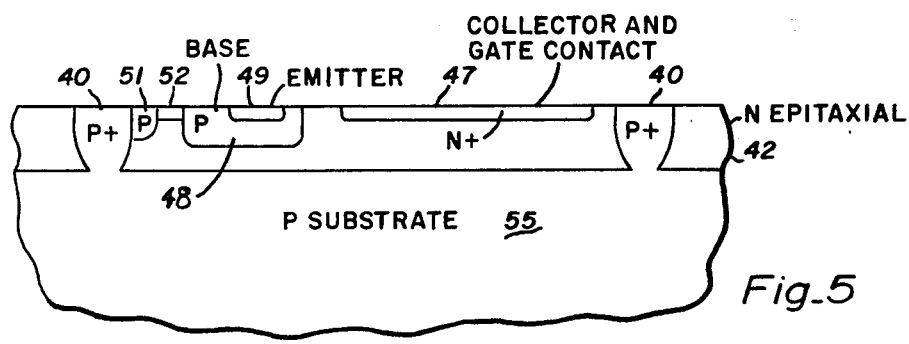
Fig_5

JFET SWITCH CIRCUIT

This is a division of application Ser. No. 754,482 filed Dec. 27, 1976, now U.S. Pat. No. 4,085,417.

BACKGROUND OF THE INVENTION

Analog signal switches have been developed in a multitude of forms. The most popular employ a large area junction field effect transistor (JFET) as the switch. This JFET is designed to have a low on resistance compatible with the analog circuit being switched. The JFET gate is driven, to switch the device, by a circuit that must be capable of charging and discharging the gate (plus stray) capacitance as rapidly as required for the designed switching speed. This typically involves high-current, high-slew-rate amplifiers. Since the analog signals being switched often have d-c components associated, along with faily large signal levels, the JFET gate must track the analog signal in the on state to make sure that the switch stays on. The above requirements place severe demands upon the gate switching circuits. Many prior art circuits operate well for some but not all requirements. For example, many circuits operate well but draw excessive quiescent current in the on state, off state, or both.

Finally, the circuit should be capable, if desired, of not inducing transients into the analog circuits being switched. Some of the prior art circuits work well, but, when they slew the JFET gate, have a tendency to shock excite the circuits connected to the source-drain portion of the JFET switch.

SUMMARY OF THE INVENTION

It is an object of the invention to provide a JFET switch and control circuit wherein the combination draws very little quiescent current but can switch very rapidly.

It is a further object of the invention to provide a JFET switch and a control circuit that can track the d-c potential of the signal being switched over a wide range of voltage.

It is a still further object of the invention to provide a JFET switch and control circuit that can switch analog signals very rapidly, yet does not produce a transient reaction in the analog circuit being switched.

These and other objects are achieved in the circuit to be characterized in the following description. A JFET has its souce-drain circuit coupled to the analog circuit to be switched. Its gate is coupled to a pair of driving circuits, one for turning it off by charging gate capacitance and one for turning it on by discharging its gate capacitance. The turn off driver comprises a charging current source in the form of a base-driven switched bipolar transistor. The turn on driver comprises a bipolar transistor, the base of which is driven by a switched current source and a small JFET whose gate is coupled to the gate of the switch JFET. When the gate capacitance is to be discharged, the bipolar transistor is turned on by the switched current source and acts as a low resistance discharge path. After capacitance discharge, the small JFET is the only current drain element and its current flow can be made very small.

If it is desired to avoid capacitance charge and discharge transients from reacting upon the analog circuit, a buffer amplifier is coupled between the analog circuit terminal and the capacitance discharge transistor.

BRIEF DESCRIPTION OF THE DRAWING

FIG. 1 is a schematic diagram of the circuit of the invention;

FIG. 2 is a schematic diagram of a buffer amplifier for use with the circuit of FIG. 1;

FIG. 4 is a cross section of the integrated circuit of FIG. 3, showing the details of the switching JFET; and FIG. 5 is a cross section of the integrated circuit of FIG. 3 showing the details of the bipolar transistor and the associated driver JFET.

DESCRIPTION OF THE INVENTION

Figure 3:
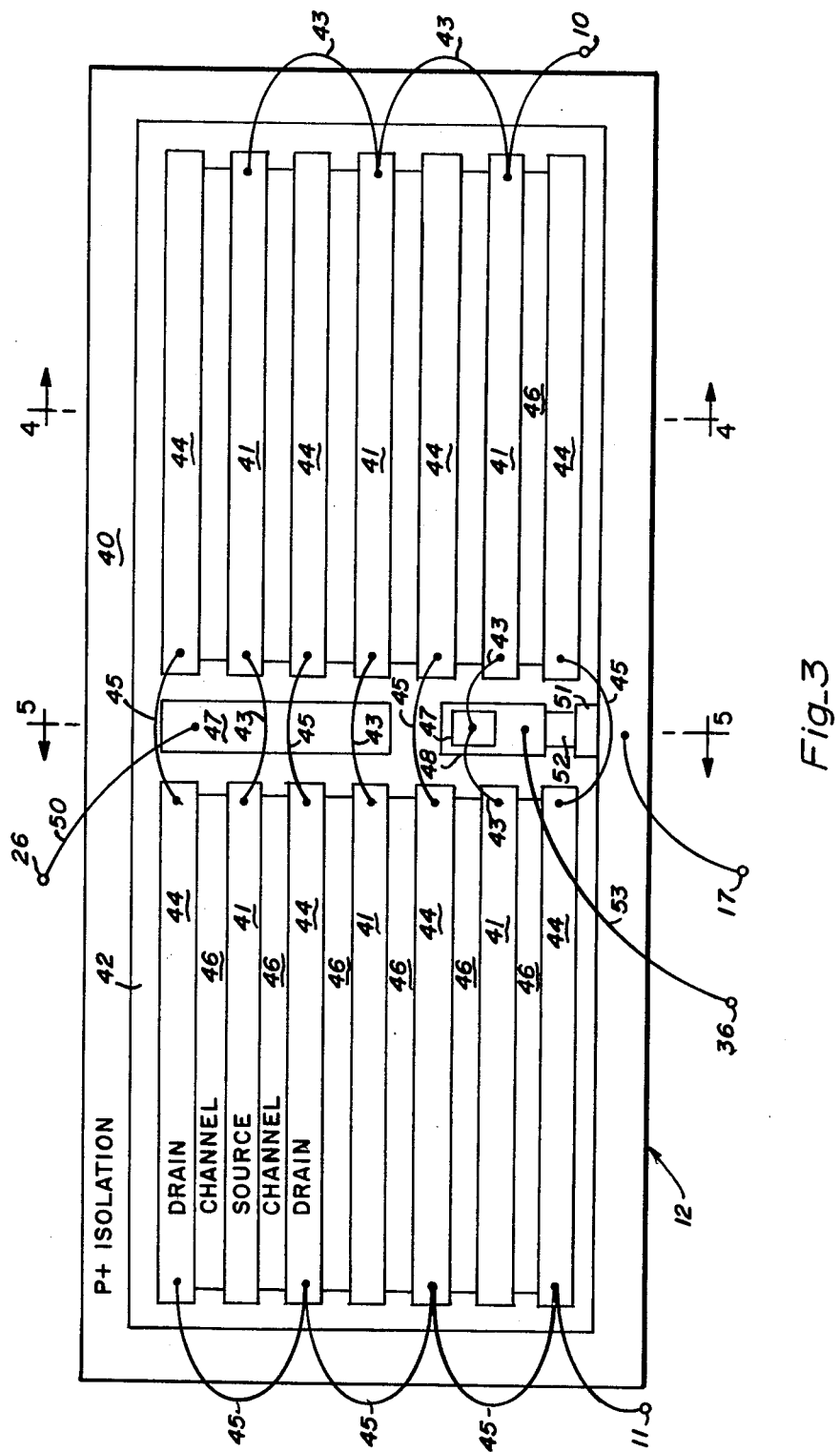
FIG. 3 shows the topography of an integrated circuit useful in implementing the essential part of the circuit of FIG. 1.

FIG. 1 shows the essential elements of a complete switch and driver circuit. An analog signal is applied to input terminal 10. When the switch is on the analog signal will appear at output terminal 11. The device behaves as a simple SPST switch toggled electronically by the driver circuit. By employing an array of such switches, with associated drivers, virtually any switching function can be accomplished. For example, if two such switches are operated from a single toggle current, a SPDT function can be obtained.

The heart of the device is a combined bipolar transistor and JFET array shown inside dashed outline 12. This device responds to toggle currents for switch operation. A current $I_3$ will turn the switch off and a current at $I_2$ will turn the switch on.

JFET 13 is the device that actually controls the analog signal. It is a large area device designed to handle whatever analog signal currents are specified and to have a sufficiently low on resistance. Its source receives the analog input at terminal 10 and its drain supplies the analog output on terminal 11. The gate of JFET 13 is coupled to the gate of JFET 14 and the collector of bipolar transistor 15. The emitter of transistor 15 is returned to terminal 10 and its base is coupled to the source of JFET 14.

The basic driver circuit operates from a power supply connected to terminals 16 for $+V$ and terminal 17 for $-V$. This power supply, while independent of the analog source, is usually equal positive and negative potentials referenced to ground as the midpoint. The analog signal then represents an a-c value referenced to ground. However the analog signal can have a substantial d-c component. The circuit of FIG. 1 is self adjusting, within limits, to the d-c level applied to terminal 10 as will be described hereinafter.

The driver circuit is operated from input terminals 20 and 21 which are coupled to a differential transistor pair 22. This pair is operated at $I_1$ from current source 23. When input terminal 21 is positive with respect to terminal 20, transistor 22b will conduct $I_1$ and turn transistor 24 on because the base of transistor 24 is directly coupled to the collector of transistor 22b.

When input terminal 21 is negative with respect to terminal 20, transistor 22a will conduct $I_1$ to directly coupled transistor 25. Since transistor 25 is a double collector device with one collector connected to its base. The ratio of $I_2$ to $I_1$ will be equal to the ratio of the collectors of transistor 25. If the two collectors are the same size, $I_2$ will equal $I_1$. This is the preferred condition.

When terminal 21 is positive with respect to terminal 20, and transistor 22b conducts, transistor 24 is turned on and $I_3$ flows to node 26. This will pull node 26 toward +V and turn the switch off. The turn off time is determined by how fast transistor 24 can charge the capacitance at node 26. This capacitance resides largely in the gate capacitance of JFET 13 but will include other stray circuit capacitances. Since the maximum value of $I_3$ is equal to $I_1$ multiplied by the current gain of transistor 24, node 26 can be charged or slewed at a very rapid rate. Once the capacitance of node 26 is charged, transistor 24 will saturate and $I_3$ will drop to substantially the leakage value of node 26 which is small. Thus the switch driver current drain, once the turn-off transient is completed, is equal to $I_1$.

When input terminal 21 is negative with respect to terminal 20, and transistor 22a conducts, the switch is turned on as follows. To begin with assuming that node 26 is initially charged to substantially +V, JFET 14 will be turned off. As explained above $I_2$ equals $I_1$ and all of this current will flow into the base of transistor 15 thus turning it on. This couples node 26 to input terminal 10 and the capacitance will rapidly discharge thereby pulling node 26 toward the source potential of JFET 13 to turn the switch on. When active, transistor 15 will multiply $I_2$ by its current amplification to very rapidly slew the node 26 voltage. Once the potential at node 26 drops, JFET 14 turns on and diverts current around the base of transistor 14 thereby turning transistor 14 off. It can be seen that JFET 14 acts as a source follower to set the level of the base voltage on transistor 15. If the $I_{DSS}$ of JFET 14 is made equal to $I_2$, JFET 14 will conduct $I_2$ when its gate potential is equal to its source potential. This means that the base current of transistor 15 will drop to zero when the potential at node 26 is equal to the potential at the base of transistor 15. For this condition input terminal 10 will be at a potential about 0.5 volt (at room temperature) below node 26. In other words, the driver circuit will self adjust to drive node 26 to a potential below about 0.5 volt positive with respect to terminal 10. Following the turn on transient, during which transistor 15 can conduct heavily, the total driver current drain will be equal to $I_1$.

If the d-c value of the analog signal applied to terminal 10 rises toward +V, it can be seen that transistor 15 will remain off and node 26 can float upward. If the rise is sufficient to forward bias the gate-source junction of JFET 13, node 26 will be clamped to within one diode drop of the potential of terminal 10.

If the d-c value of the analog signal applied to terminal 10 falls toward −V, it can be seen that transistor 15 will turn on and slew node 26 in a negative going direction to follow. Once node 26 arrives at the termianl 10 potential (actually about 0.5 above it) transistor 15 will turn off as described above.

From the foregoing it can be seen that the circuit has low quiescent current drain (equal to $I_1$), rapid transient action, and the ability to track the analog signal. However, it can also be seen that the transient action may require substantial currents to flow into terminal 10. If the analog signal source connected to terminal 10 has a very low source impedance, there is no problem. In the case of an analog signal source having a substantial impedance, the above described transients can react adversely upon the analog circuit performance. When such transient reaction may be a problem, the circuit of FIG. 2 can be employed.

FIG. 2 represents a buffer amplifier to be connected into the circuit of FIG. 1 for improving transient performance. To use the FIG. 2 buffer the circuit connection in FIG. 1 labeled 30 is broken. Node 31 of FIG. 2 is then coupled to the emitter of transsitor 15 and the gate of JFET 32 coupled to terminal 10.

In FIG. 2, JFET 32 is coupled in parallel with bipolar transistor 33. This combination is disclosed and claimed in my copending application titled A COMPOSITE JFET-BIPOLAR TRANSISTOR STRUCTURE Ser. No. 754,290 filed Dec. 27, 1976 new U.S. Pat. No. 4,095,252. As described in this copending application, when the input potential is close to the potential at node 31, JFET 32 will act as the active device. In this case it will act as a source follower. When the input potential exceeds the transistor turn on potential, transistor 33 turns on and becomes an emitter follower. In either case the circuit acts with respect to −V. JFET 34 connected as a current source couples node 31 to +V and acts as a load device. Thus for small signals a JFET source follower having modest current capability is present. For large signals a transistor emitter follower of substantially greater current capability is available. When the circuit of FIG. 2 is employed with that of FIG. 1, the transient reactions of the circuit at terminal 10 will be reduced by at least the current gain of transistor 33 and this can be a large number. For small transients, the isolation is even greater.

One of the outstanding advantages of the circuit of FIG. 1 is its amenability to integrated circuit manufacturing. FIG. 3 shows the topography of the elements inside the dashed outline labeled 12. Both JFET 13 and JFET 14, along with bipolar transistor 15, are contained within a coventional isolated portion of an integrated circuit (IC). The other elements of FIG. 1 can be located on adjacent portions of the IC chip.

In FIG. 3 only a portion of a chip is shown and the metalization and oxide portions, ordinarily used in a planar IC construction, have been omitted for clarity. Element 40 represents a P+ type isolation ring diffused through an n-type epitaxial layer that has been deposited on a p-type substrate as is conventional in the IC art. To make JFET 13 a series of elongated p-type source diffusions 41 are established inside the n-type epitaxial material 42 that is isolated by ring 40. Six such sources are shown but more or fewer could be used. The ordinary metalization has been omitted and, since this would ordinarily interconnect the sources, wires 43 are employed to schematically show the connections. Each source is flanked by a drain electrode with eight being shown at 44. The drains are connected schematically by wires 45.

The sources 41 are separated from the drains 44 by thin p-type channels 46, with twelve being illustrated. A section taken at line 4—4 is shown in FIG. 4 where the sources 41, drains 44, and channels 46 are detailed. It can be seen that a JFET having a very large channel width-to-length ratio is available to perform the switching function of JFET 13 of FIG. 1. When biased on such a structure has a very low source to drain resistance between terminals 10 to 11.

Contact to the JFET gate is made by a heavily n-type doped region 47 in FIG. 3. This region constitutes an ohmic contact to the epitaxial semiconductor material that lies inside isolation ring 40 as shown in FIG. 3.

Transistor 15 of FIG. 1 is completed as shown in FIG. 3 by diffusing a p-type base region 48 into the epitaxial semiconductor, and then diffusing an n-type emitter 49 inside the base region, as is conventional in double diffused planar transistor technology. Line 5—5 taken through the structure of FIG. 3 is shown in section in FIG. 5. It can be seen that the p-type base diffusion 48 extends into the eiptaxial material 42 which acts as the transistor 15 collector. The JFET gate contact 47 thus also automatically becomes the bipolar transistor collector connection. A wire 50 is shown as a schematic connection of region 47 to become circuit node 26.

While the transistor base 48 is being diffused, cap 51 is formed at a controlled spacing from base 48 and is designed to overlap isolation region 40. The channel of JFET 14 of FIG. 1 is then formed as shown in FIGS. 3 and 5 as a thin p-type region 52. Thus JFET 14 has its drain connected to the substrate via regions 51 and 40 and its source is the end of base 48 facing cap 51. The gate is also region 42 and is integrally connected thereto as part of circuit node 26. Wire 53 is shown schematically in FIG. 3 as the external connection to circuit node 36.

While not shown in FIGS 3-5 a conventional conductive buried layer could advantageously be employed. In this case, prior to establishing epitaxial layer 42, a heavily doped N-type region is diffused into substrate 55 inside of the subsequently diffused isolation ring 40. After growing the epitaxial layer and processing the wafer the buried layer provides a low resistance contact to the underside or buried portion of the epitaxial layer. This then would provide a low resistance connection for circuit node 26. The buried layer also greatly reduces the possibility of substrate injection where the p-type diffusions act as emitters and the epitaxial material acts as a base region with the substrate acting as a collector.

Another improvement not shown but well known in the art is the use of subsurface JFET channels. In this case the channels indicated at 46 and 52 in FIGS. 3-5 are overlaid with a thin n-type cap. This cap is made slightly larger than the channel so as to overlap and be in ohmic contact with the gate region 42. It is made thin enough to overlay the channel. This means that the channel is buried below the semiconductor surface and has gate contacts on both sides. This greatly improves JFET performance. Typically the JFET channel and cap regions are manufactured using ion implantation which provides precise control of their depth area, and impurity concentration. The remainder of the device electrodes are typically made by conventional oxide masked diffusions.

The above description has been directed to a p-type substrate and an n-type epitaxial layer. In fact all conductivity types could be reversed, using an n-type substrate and a p-type epitaxial layer. The power supply polarities would also be reversed. If this were done all of the devices shown in FIGS. 1 and 2 would be complementary to what is shown.

Clearly there are other alternatives and equivalents within the scope and intent of the invention. For example other forms of isolation and device construction could be used and the circuit aspect of the invention could be implemented with discrete devices. Accordingly it is intended that the scope of the invention be limited only by the following claims.

I claim:

1. A JFET-bipolar transistor analog signal switching circuit comprising:

a switching JFET having its source and drain terminals coupled to a pair of analog signal switching terminals, said switching JFET acting as a relatively high impedance between said analog signal switching terminals when its gate capacitance is charged to a potential greater than its pitch off voltage rating and acting as a relatively low impedance between said analog signal switching terminals when its gate capacitance is discharged to a potential lower than its pinch off voltage rating;

a first bipolar transistor having its collector electrode coupled to the gate electrode of said switching JFET and having its emitter electrode coupled to a terminal connectible to a source of potential that exceeds said pinch off voltage rating;

a second bipolar transistor having its collector electrode coupled to the gate electrode of said switching JFET and having its emitter electrode coupled to a terminal connectible to a source of potential that is less than said pinch off voltage rating;

a driver JFET connected as a source follower having its source coupled to the base of said second bipolar transistor and to a constant current source, the gate of said driver JFET being coupled to said gate of said switching JFET;

means for supplying a first switching signal to said first bipolar transistor; and means for supplying a second switching signal, complementary to said first switching signal, to said constant current source whereby when said first bipolar transistor is on said switching JFET is off and when first bipolar is off said switching JFET, said second bipolar transistor, and said driver JFET are on.

2. The circuit of claim 1 wherein said driver JFET has a current rating at zero gate to source voltage that is approximately equal to the current rating of said constant current source.

3. The circuit of claim 1 wherein said switching JFET and said driver JFET are of the p-channel polarity, said first bipolar transistor is of the PNP polarity, and said second bipolar transistor is of the NPN polarity.

4. The circuit of claim 1 wherein said switching JFET and said driver JFET are of the n-channel polarity, said first bipolar transistor is of the NPN polarity, and said second bipolar transistor is of the PNP polarity.

5. The circuit of claim 1 wherein said second bipolar transistor has its emitter coupled to the output of an amplifier operating from a source of potential that exceeds said pinch off potential in one polarity and is less than said pinch off in the other polarity, said amplifier input being coupled to said source of said switching JFET.

6. The circuit of claim 5 wherein said amplifier comprises:

a bipolar transistor having emitter, base, and collector electrodes;

a JFET having a source coupled to said emitter, a gate coupled to said base and a drain coupled to said collector; and a constant current device coupled between said JFET source and one terminal of a power supply rail; said drain and collector electrodes being coupled to the other rail of said power supply whereby said gate and base electrodes constitute said amplifier input and said source and emitter electrodes constitute said amplifier output.

* * * * *